United States Patent
Martin

(10) Patent No.: US 7,265,747 B2
(45) Date of Patent: Sep. 4, 2007

(54) OPTICALLY BASED OPERATING DEVICE FOR A HOUSEHOLD APPLIANCE

(75) Inventor: Baier Martin, Ettlingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 0 days.

(21) Appl. No.: 11/381,566

(22) Filed: May 4, 2006

(65) Prior Publication Data
US 2006/0187200 A1 Aug. 24, 2006

Related U.S. Application Data

(63) Continuation of application No. PCT/EP2004/012400, filed on Nov. 3, 2004.

(30) Foreign Application Priority Data
Nov. 5, 2003 (DE) .................. 103 52 714

(51) Int. Cl.
G09G 5/00 (2006.01)

(52) U.S. Cl. .................. 345/173; 345/179; 345/156; 345/168; 345/169

(58) Field of Classification Search .................. 345/107, 345/33, 173, 179, 156–169; 178/18.01–18.11; 340/336, 929, 815.4, 712, 378.2; 200/5, 200/600; 235/454; 219/452.11, 10.55; 187/391; 179/6.09; 324/770; 702/61; 368/10
See application file for complete search history.

(56) References Cited

U.S. PATENT DOCUMENTS

| | | | |
|---|---|---|---|
| 3,936,816 A | * | 2/1976 | Murata .................. 345/50 |
| 4,011,428 A | * | 3/1977 | Fosnough et al. .......... 219/719 |
| 4,146,883 A | * | 3/1979 | Appeldorn et al. .... 340/815.44 |
| 4,221,328 A | * | 9/1980 | Kramer .................. 235/454 |
| 4,274,149 A | * | 6/1981 | Flanagan .................. 368/10 |
| 4,328,397 A | * | 5/1982 | Chamberlin .................. 379/75 |
| 4,567,480 A | | 1/1986 | Blanchard |

(Continued)

FOREIGN PATENT DOCUMENTS

DE   40 07 971 A1   9/1991

(Continued)

OTHER PUBLICATIONS

German Search Report for German Application No. 103 52 714.1.

(Continued)

Primary Examiner—Bipin Shalwala
Assistant Examiner—Prabodh Dharia
(74) Attorney, Agent, or Firm—Alston & Bird LLP

(57) ABSTRACT

An operating element can be used to operate or control a household appliance, for example a cook top heating element. A seven-segment display is arranged beneath a cover in the region of a contact surface. A light source and a light receiver are arranged inside respectively of four LED elements of the seven-segment display in two channel-type openings oriented towards the contact surface. The insertion of the light source and receiver into the openings enables the contact surface to the positioned directly above the display and shields the light receiver from scattered light. Placement of a finger on the contact surface results in light from the light source to be reflected and detected by the light receiver, and thus effect control of the household appliance.

10 Claims, 1 Drawing Sheet

U.S. PATENT DOCUMENTS

| | | | | |
|---|---|---|---|---|
| 5,977,878 A | * | 11/1999 | Lang | 340/815.4 |
| 6,236,024 B1 | * | 5/2001 | Gotz et al. | 219/452.11 |
| 6,326,947 B1 | * | 12/2001 | Capps | 345/156 |
| 6,403,904 B1 | | 6/2002 | Schilling | |
| 6,550,586 B1 | * | 4/2003 | Takeuchi | 187/391 |
| 2001/0020578 A1 | | 9/2001 | Baier | |
| 2002/0005790 A1 | * | 1/2002 | Georgalis | 340/929 |
| 2002/0162730 A1 | * | 11/2002 | Gremm et al. | 200/5 R |
| 2004/0006439 A1 | * | 1/2004 | Hunter | 702/61 |
| 2005/0156870 A1 | * | 7/2005 | Flinner et al. | 345/107 |
| 2006/0290374 A1 | * | 12/2006 | Fisher et al. | 324/770 |

FOREIGN PATENT DOCUMENTS

| | | |
|---|---|---|
| DE | 40 41 144 C1 | 4/1992 |
| DE | 4041144 | 4/1992 |
| DE | 197 00 836 C1 | 5/1998 |
| DE | 199 17 110 A1 | 10/2000 |
| EP | 0446642 | 9/1991 |
| JP | 56-162135 | 12/1981 |

OTHER PUBLICATIONS

International Search Report from PCT/EP2004/01240 dated Mar. 22, 2005.

* cited by examiner

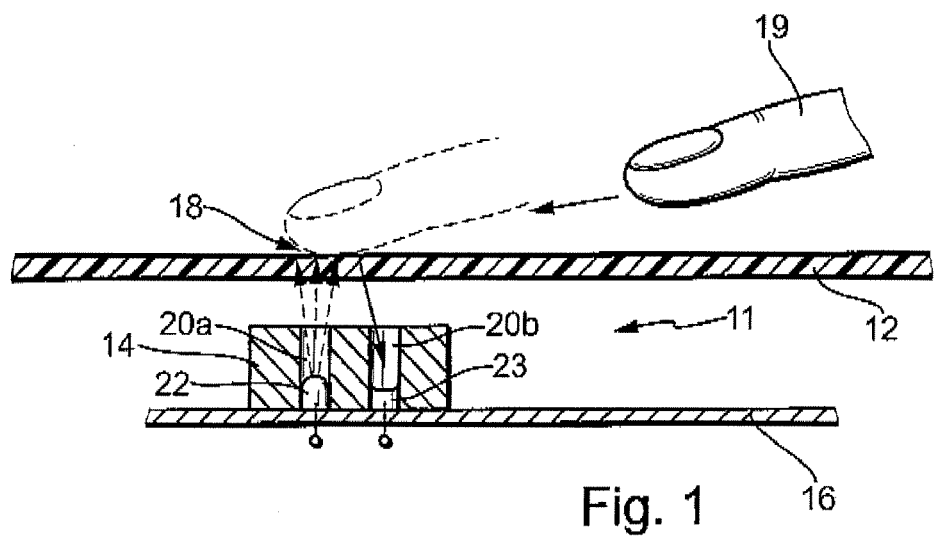
Fig. 1
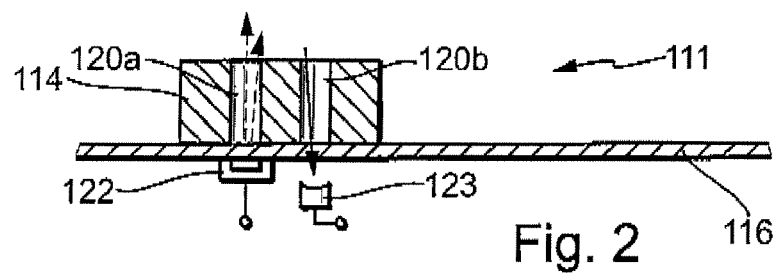
Fig. 2
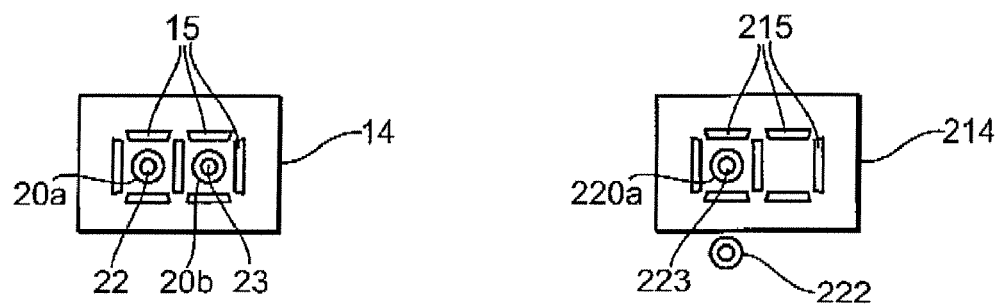
Fig. 3
Fig. 4

OPTICALLY BASED OPERATING DEVICE FOR A HOUSEHOLD APPLIANCE

CROSS-REFERENCE TO RELATED APPLICATIONS

This application is a continuation of PCT/EP2004/012400 filed on Nov. 3, 2004, which in turn claims priority to German Appl. No. 10352714.1 filed on Nov. 5, 2003.

FIELD OF INVENTION

The invention relates to an operating device for operating an electrical appliance, such as a domestic appliance, for example a cooktop having heating elements or the like, or in general terms, for operating an apparatus.

BACKGROUND

Such equipment or operating devices incorporate, in part, seven-segment displays and also touch or contact switches for the operating process. One such operating device is, for example, disclosed in EP 1 030 536 A1. The contact switch in that disclosure is constructed as a capacitive contact switch. It is also known to construct similar contact switches using reflected light barriers with a light source and a light receiver. This can for example be gathered from DE 197 00 836 C1.

The problem of the invention is to how to provide an operating device similar to the aforementioned type, while making it possible to avoid the disadvantages of the prior art and permitting the combination of a seven-segment display with a reflected light barrier in an advantageous and practical manner.

BRIEF DESCRIPTION OF THE DRAWINGS

The following diagrammatic drawings are provided, which are not necessarily drawn to scale:

FIG. 1 discloses one embodiment of the present invention disclosing a lateral section through the operating device under a cover.

FIG. 2 discloses another embodiment of the present invention.

FIG. 3 dicloses a plan view of one embodiment of the seven-segment display.

FIG. 4 discloses a plan view of another embodiment of the seven-segment display.

DETAILED DESCRIPTION

Advantageous and preferred developments of the invention form the subject matter of further claims and are explained in greater detail hereinafter. By express reference the wording of the claims is made into part of the content of the description.

According to one embodiment of the invention, a seven-segment display is used to display information associated with an operating state or provide instructions to an operator of a household appliance. The seven segment display also functions as a contact switch by using a light channel involving a light barrier, a light source, and a light receiver. The light travels along a specific light beam path between light source, striking a reflective barrier (over which a finger is positioned), and then detected by a light receiver. The light source and light receiver are positioned in such a way that the light beam path at least passes once centrally through a portion of the seven-segment display or through areas formed by its segments, which are essentially closed all-round. This means that the light barrier is positioned centrally in a portion, or below, the seven-segment display. This arrangement saves space, because normally displays and light barriers are juxtaposed and consequently require a certain width. This also permits a much simpler and more instinctive operation, because an operator only has to place a finger directly on the display, or the event indicated by the display, in order to carry out the desired operation. Savings are made because there is no need for the otherwise conventionally used surface indicia or decoration. The operating safety and comfort are also increased, because in the case of where there are many indicia on the top of a contact surface, it is not always clearly apparent at which precise point contact must take place in order to trip the contact switch.

In addition, this arrangement makes it possible to create operating devices with contact switches that can be operated in a very satisfactory manner under otherwise poor lighting conditions. No separate displays or illuminants are required in order to mark the contact surface.

In order to further improve the spatial positioning of the light barrier and display, it can be advantageous for the reflected light to travel along a path (both going away from the light source and going to the light receiver) passing through in each case a substantially closed channel or through the seven-segment display. According to one embodiment of the invention, construction of such displays are possible by separating the two light beam paths so that one light beam path passes through one closed ring of segments, which is reflected off of the underside of the surface, and passes through the other closed ring of segments in the display.

With regards to a balance between functionality and space requirements, in one embodiment, the light beam path to the light receiver passes through the seven-segment display. Thus, in one embodiment, the distance between the contact surface, seven-segment display and the light beam path to the initiating light receiver is as short as possible.

In one embodiment, the light beam path is shielded from the light generated by the display, as it passes through the display. For example, the light beam path can pass through a closed channel. The aim is to ensure that the light reflected off of the light barrier and the light generated by the display do not interfere with one another. This can be brought about either by the use of channels to separate or shield the light beam from extraneous light, or operating the seven-segment display and light source in an alternating manner, so-to-speak, using a multiplexed operation (e.g., between detecting light at the light receiver and generating light by the display. The alternation frequency should be selected in such a way that the alternation is not visible to the human eye, but yet allows functional operation of the system.

The light beam path advantageously passes through the are formed gap between four LED elements or, in general, other lighting elements in an area of the display. The four LED elements form a closed, ring-like arrangement in polygonal, quadrangular or parallelogram-like form. It is possible to ignore the fact that in practice the elements are not in full contact at the ends, so that they are always to be looked upon as closed in the sense of the invention.

Advantageously a seven-segment display is constructed as a unit. This means that at least the lighting means or LEDs, which form the individual display segments, are in a single unit or a single component. According to a further development of the invention, the light source and/or light receiver are integrated in the display or in the unit with the display. This permits a simplified installation, because fewer components have to be installed. However, the main advantage is that there is no need for adjustment of the unit relative to the light source, particularly with respect to the light beam path. This is particularly advantageous if the seven-segment display, as well as light receiver and light source are incorporated in a single unit and, as in normal components, have projecting connections or terminals. The latter can for example be soldered to a printed circuit board. The connections can be designed both for through-hole technology and for surface mount device (SMD) technology.

In the case of an operating device, it and other similar devices or displays can be placed on a common printed circuit board (PCB board). This is advantageously made possible through the fact that the path of the beam through the display automatically leads to a shielding and separation with respect to other components, particularly illuminating components (including the display itself), on the common board.

Instead of a highly integrated solution with a single unit, it is also possible for the light source and/or light receiver to be separate from the display element. This is done by placing the light source and/or light receiver below, and separately from, the display element, rather than integrating them with the display element. Thus, it is possible for an operating device with several seven-segment displays to always use the same display type, even if only one or a few of these are to be provided with associated touch or contact switches. The displays are then advantageously located in their own units, which are provided with openings or the above-described channels. Similarly and within the scope of the present invention, it is possible to use similar principles for a contact switch in place of light barriers with a light source and a light receiver.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individual sections and the subheadings do not restrict the general validity of the statements made thereunder.

FIG. 1 is a lateral view of an operating device 11 according to one embodiment of the invention. Below a cover 12 is provided a seven-segment display 14 positioned on a printed circuit board 16. The seven-segment display is constructed as a unit and has, as can be seen from the plan view of FIG. 1, seven LED elements 15. The arrangement of the LED elements 15 or seven-segment display 14 corresponds to what is known from the prior art.

The seven-segment display 14 is positioned just below the cover 12. However, it could also be almost in contact therewith or have a greater spacing therefrom. A contact surface 18 is formed on the top surface of the cover 12 above the seven-segment display 14. A finger 19 can be placed on said contact surface 18 or at this point on cover 12 in order to operate the operating device 11.

The seven-segment display 14 or its housing has an opening 20a, 20b in in each portion of the two rings of LED elements 15. The openings are constructed in the manner of cylindrical holes or bores and can be parallel to one another. Alternatively, for the better guidance of a beam path, they can be mutually inclined in such a way that their extensions meet roughly in the centre of the contact surface 18 to which the finger 19 is applied. This arrangement facilitates the path of the light beam generated by the light source that is reflected from the bottom surface of the cover 12 to the light receiver.

In the lower area of opening 20a, or resting on printed circuit board 16, a light source 22 is located (shown on the left), whilst a light receiver 23 is contained in the right-hand opening 20b. The light source 22 can be a LED. The light receiver 23 can be a photosensitive element, for example a photoelectric cell or phototransistor. The beam path away from the light source 22 is shown in broken line form. The light is reflected at the contact surface 19 when a finger 19 is applied and at least part of the light beam passes through the right-hand opening 20b to light receiver 23. Both light source 22 and light receiver 23 are connected to a control and evaluating means (which is not shown) that effects the control of the applicance. The reflection and collection are detected by the light receiver as a user action for controlling the operation of the appliance.

One of the major advantages of this arrangement is that direct actuation on display 14 is possible, i.e., by placing a finger directly on a symbol or indicia displayed on the cover. Moreover, and as is clear from FIG. 3, the two areas formed by the space of the of two sets of four LED elements 15 of seven-segment display 14 are used for housing the operational parts of operating device 11, i.e. light source 22 and light receiver 23. Finally, there is the further advantage that the channel-like openings 20 in display 14 or its housing bring about a shielding of the partial beam paths between light source 22 and light receiver 23 and in each case the contact surface 18. The channel like openings can at least partly obviate the need for the otherwise necessary other tubes, channels, ducts or other shielding means for restricting extraneous light from interfering.

In another embodiment of operating device 111 shown in FIG. 2, the light source 122 and/or light receiver 123 can be placed below, instead of within, the housing of display 114. This is a construction in which display 114, as well as light source 122 and light receiver 123 do not form a unit, but are separate components. Components 122, 123 can be constructed so as to operate upwards and can be placed and contacted on printed circuit board 126. Alternatively they can be kept separate. It is also possible to use light guides to further remove or central lighting means.

The advantage of initiating or positioning the contact surface directly above the display 114 is fully maintained without additional expenditure. Another possible advantage, namely the use of openings 120 as a mutual shielding duct, is only possible through further tubes or the like extending the openings 120 downwards. This makes it possible to prevent stray light from the light source 122 to influence the light receiver 123. Such additional shielding means are avoided here in that the light source 122 is placed directly below the printed circuit board 126 and cannot radiate past the opening 120a.

FIG. 3 is a plan view of display 14 of FIG. 1. It can be clearly seen how the openings 20a and 20b are placed within the portion formed by the rings of segments 15 and, in each case, a light source 22 and light receiver 23 are located therein.

FIG. 4 is a plan view of a variant of the display 214 according to FIG. 1. The display 214 or its housing is provided in the left-hand ring of LED elements 215 with an opening 220a, into whose lower area is positioned a light receiver 223, much as that shown in FIG. 1.

Light receiver 223 is place below the housing of display 214. As is clearly visible, there is no need for a shield similar to a channel or opening 20 for light source 222, as is the case in the other constructions. This is due to the fact that this arrangement is considered adequate to protect the light receiver 223 against undesired stray light. This takes place through display 214 or opening 220a. This is not absolutely necessary for light source 222. However, according to a further development of the present invention, a tube or the like can be placed round an outer light receiver 223, so that the latter receives no stray

The invention claimed is:

1. An operating device for operating an electrical appliance, said operating device having a seven-segment display constructed as a unit comprising LED elements for displaying an operating state of said electrical appliance or an instruction to an operator, said operating device further having a touch or contact switch for operating purposes, wherein said touch or contact switch is constructed as a reflected light barrier and has a light source and a light receiver with a beam path going from said light source to said light receiver, wherein said beam path passes at least once centrally through a hole between four of said LED elements in ring-like form in a part of said seven-segment display.

2. The operating device according to claim 1, wherein at least said beam path of said reflected light to said light receiver passes through a light channel in said seven-segment display.

3. The operating device according to claim 1, wherein said beam path both from said light source and to said light receiver in each case passes once through a first light channel and a second light channel in said seven-segment display.

4. The operating device according to claim 3, wherein both said beam paths are separated.

5. The operating device according to claim 1, wherein in said seven-segment display a closed light channel is provided for said beam path to run through said closed channel.

6. The operating device according to claim 1, wherein said beam path passes away from said light source through a light channel between four said LED elements in ring-like form and towards said light receiver through a light channel between four said LED elements in ring-like form.

7. The operating device according to claim 1, wherein said seven-segment display is a single component having said light source and said light receiver integrated therein.

8. The operating device according to claim 1, wherein said LED elements as well as said light source and said light receiver are placed on a common board.

9. The operating device according to claim 1, wherein said light source or said light receiver is placed below and separately from said seven-segment display.

10. An operating device for operating an electrical appliance, said operating device having a display comprising seven LED elements for displaying an operating state of said electrical appliance or an instruction to an operator, wherein said seven LED elements are arranged in two groups of ring-like form, said operating device further having a touch or contact switch for operating purposes, wherein said touch or contact switch is constructed as a reflected light barrier and has a light source and a light receiver with a beam path going from said light source to said light receiver, wherein said beam path passes away from said light source through a first light channel formed between four of said LED elements in a first ring-like form in a first part of said display and wherein said beam path passes toward said light receiver and further passes through a second light channel formed between another four of said LED elements in a second ring-like form in a second part of said display.

* * * * *

UNITED STATES PATENT AND TRADEMARK OFFICE
CERTIFICATE OF CORRECTION

PATENT NO. : 7,265,747 B2
APPLICATION NO. : 11/381566
DATED : September 4, 2007
INVENTOR(S) : Martin It is certified that error appears in the above-identified patent and that said Letters Patent is hereby corrected as shown below:

<u>Title page,</u>

Item (57) ABSTRACT, line 9, after "to", "the" should read --be--.

<u>Column 5,</u>

Line 8, after "stray" insert --light.--

Signed and Sealed this

Eighteenth Day of December, 2007

JON W. DUDAS
*Director of the United States Patent and Trademark Office*